(12) United States Patent
Matsumoto (10) Patent No.: US 7,066,390 B2
(45) Date of Patent: Jun. 27, 2006

(54) METHOD FOR MANUFACTURING SEMICONDUCTOR DEVICE

(75) Inventor: Ryoichi Matsumoto, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 1120 days.

(21) Appl. No.: 09/864,189

(22) Filed: May 25, 2001

(65) Prior Publication Data

US 2002/0019063 A1   Feb. 14, 2002

(30) Foreign Application Priority Data

Jul. 6, 2000   (JP) .............................. 2000-205215

(51) Int. Cl.
*G06K 7/06*   (2006.01)

(52) U.S. Cl. ..................... 235/441; 235/492

(58) Field of Classification Search ................ 235/441, 235/492, 486, 491, 493; 438/2; 437/211, 437/209

See application file for complete search history.

(56) References Cited

U.S. PATENT DOCUMENTS

| | | | | |
|---|---|---|---|---|
| 5,188,984 A | * | 2/1993 | Nishiguchi | .................. 438/107 |
| 5,466,971 A | * | 11/1995 | Higuchi | ....................... 257/751 |
| 5,789,792 A | * | 8/1998 | Tsutsumi | ..................... 257/506 |
| 5,946,167 A | * | 8/1999 | Hara et al. | ................... 360/322 |
| 6,002,383 A | * | 12/1999 | Shimada | ....................... 345/87 |

FOREIGN PATENT DOCUMENTS

JP   4-116975   4/1992
JP   52-127157   10/1997

\* cited by examiner

*Primary Examiner*—Thien M. Le
(74) *Attorney, Agent, or Firm*—Volentine Francos & Whitt, PLLC

(57) ABSTRACT

A method for manufacturing a semiconductor device suppresses electric charge charged up in a semiconductor layer of an SOI substrate at the time of ion implantation, preventing a BOX layer and a gate oxide from being damaged. A field oxide film is formed on a semiconductor layer formed on a BOX layer. A conductive layer is formed on the field oxide film and a gate oxide film as well. The conductive layer made of amorphous carbon is formed by sputtering and has a thickness of 5 nm to 10 nm. B+ is implanted in the interface between the semiconductor layer and the gate oxide film by an intermediate dose ion implanter. The electric charge generated in the semiconductor layer at the time of ion implantation results in FN current, which is removed through the gate oxide film and the conductive layer.

27 Claims, 9 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device, and more particularly relates to a method for forming a semiconductor element on a Silicon On Insulator (referred to as "SOI" hereinafter) substrate.

This application is a counterpart application of Japanese application Serial Number 205125/2000, filed on Jul. 6, 2000, the subject matter of which is incorporated herein by reference.

2. Prior Art

Recently, in the manufacture of semiconductor devices, it has become one of subject technical requirements to obtain semiconductor devices with ultra high speed performance and low electric power consumption. In order to comply with such a technical requirement, there has been proposed a technique for forming a large scale integrated circuit (referred to as "LSI" hereinafter) on the SOI wafer. For instance, as shown in FIG. 6e of the accompanying drawings, there is formed on the SOI wafer 12 a prior art semiconductor device 10 having a field effect transistor (referred to as "FET" hereinafter) of the metal oxide semiconductor (referred to as "MOS" hereinafter) type, according to the manufacturing steps as described in the following. FIGS. 6a to 6e of the accompanying drawings are schematic cross sectional illustrations of the prior art semiconductor device 10 for use in explanation of the prior art manufacturing steps thereof. FIGS. 7a and 7b of the same are also schematic cross-sectional illustrations of the semiconductor device 10 for use in explanation of the state of the semiconductor device 10 under the ion implantation process.

Figure 6A:
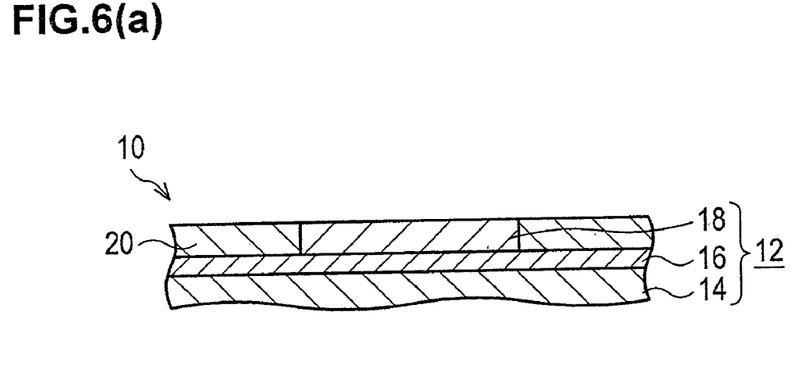
FIGS. 6a to 6e are schematic cross-sectional illustrations for describing the steps of a prior art method for manufacturing a semiconductor device.
Figure 6B:
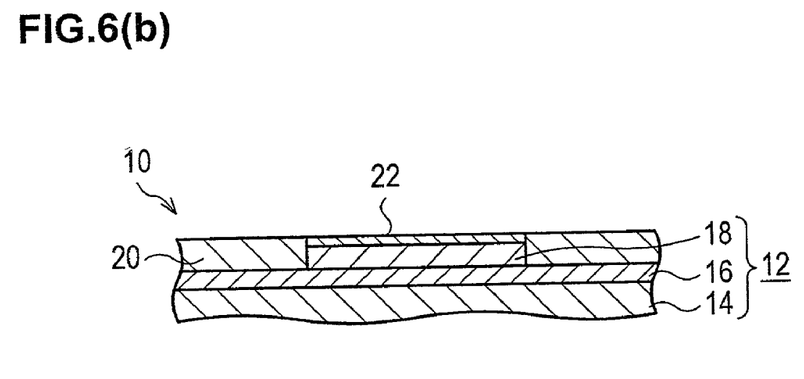
Figure 6C:
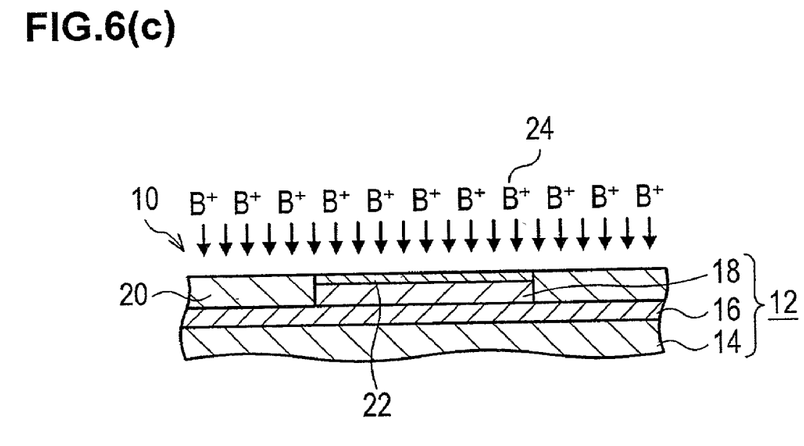
Figure 6D:
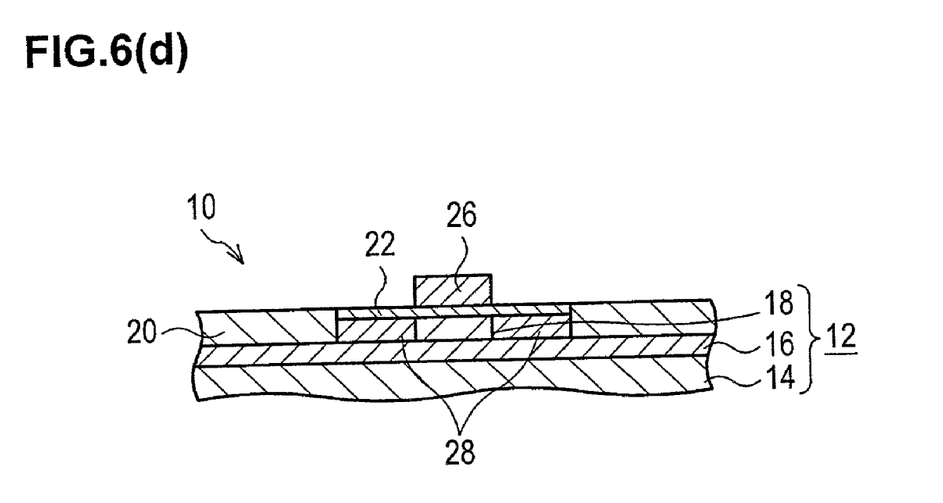
Figure 6E:
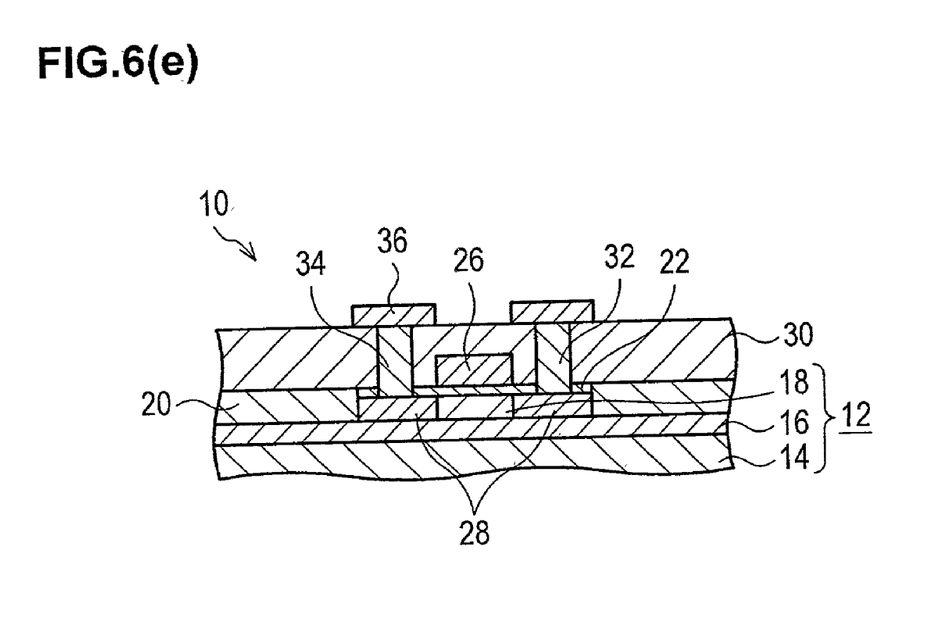
Figure 7A:
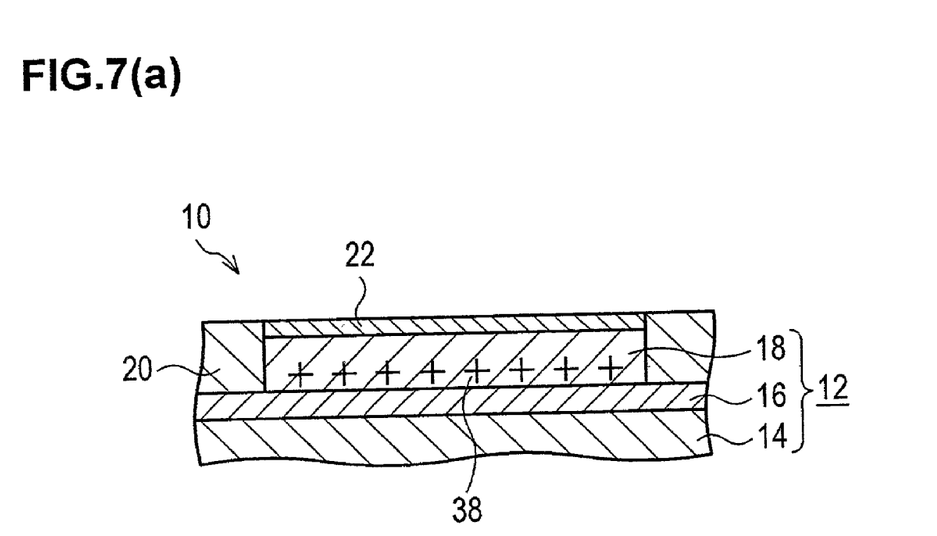
FIGS. 7a and 7b are schematic cross-sectional illustrations for describing the state of the semiconductor device at the time of the ion implantation as shown in FIG. 6c.
Figure 7B:
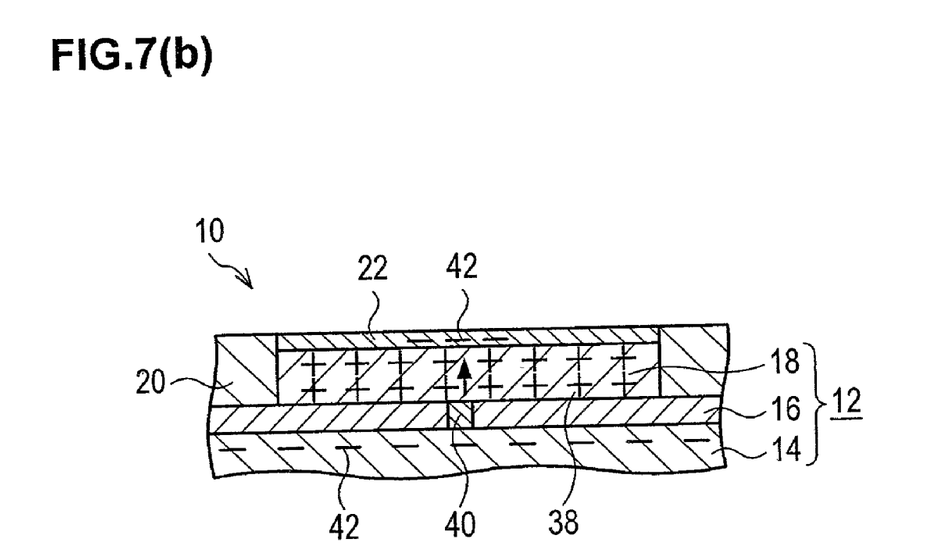

As shown in FIG. 6a, the SOI wafer 12 includes a buried oxide (referred to as "BOX" hereinafter) layer 16 stacked on a semiconductor substrate 14 and a semiconductor layer 18. To begin with, a field oxide film 20 is formed on the semiconductor layer 18, thereby insulating the semiconductor layer 18 with the BOX layer 16 and the field oxide film 20. Then, as shown in FIG. 6b, a gate oxide film 22 is formed on the semiconductor layer 18. Furthermore, as shown in FIG. 6c, channel ions of a medium dose amount are implanted in the interface between the semiconductor layer 18 and the gate oxide film 22. Still further, as shown in FIG. 6d, a source/drain region 28 is formed in the semiconductor layer 18 after forming a gate electrode 26 on the gate oxide film 22. Finally, an FET of the MOS type (referred to as "MOSFET" hereinafter) is completed by forming a inter-layer insulating film 30, contact holes 32, buried plugs 34, and a wiring layer 36. In the MOSFET formed on the SOI wafer 12, the channel region and the source/drain region 28 are formed on the BOX layer 16. Therefore, an LSI of the low power consumption type can be achieved without forming any depletion layer in the semiconductor substrate 14.

In the prior art semiconductor device 10, however, it has been experienced that the gate oxide film 22 is damaged or destroyed in the process of the channel ion implantation as shown in FIG. 6c. According to the knowledge of the inventor of this application, there is a relation among the dose amount of ion (B+) 24 (I), the damage occurrence percentage of gate oxide film 22 (II), and the charge-up potential difference of semiconductor layer 18 (III) as shown in the following Table 1.

TABLE 1

| dose amount of ion (ion/cm2) | the damage occurrence percentage of gate oxide film (%/mm2) | charge-up potential difference of the semiconductor layer (V) |
|---|---|---|
| $2 \times 10^{12}$ | 0 | 10.7 |
| $4 \times 10^{12}$ | about 4 | 21.4 |
| $8 \times 10^{12}$ | about 7 | 42.8 |
| $9 \times 10^{12}$ | 30 to 35 | 48.0 |

As will be seen from Table 1, the charge-up potential difference of the semiconductor layer 18 rises in response to the increase in the dose amount of the ion 24. Generally, if the SOI wafer 12 is formed by means of the Separation by Implanted Oxygen (referred to as "SIMOX" hereinafter) method, it is said that the dielectric withstanding voltage of the BOX layer 16 has a value in the voltage range of 40V to 60V. Therefore, if the charge-up potential difference of the semiconductor layer 18 is increased to approach a value of the dielectric withstanding voltage of the BOX layer 16, the damage occurrence rate (%) in the gate oxide film 22 is increased, accordingly. In the present specification, a term "dielectric withstanding voltage" is defined as an upper limit voltage at which a predetermined insulating layer may withstand without receiving any damage.

As described above, the semiconductor layer 18 is insulated with the BOX layer 16 and the gate oxide film 22 as well. Because of this, if ions 24 are implanted in the interface between the semiconductor layer 18 and the gate oxide film 22, the electric charge (+) 38 of the implanted ion 24 is charged up in the semiconductor layer 18 as shown in FIG. 7a. Furthermore, as shown in FIG. 7b, if the amount of the electric charge of the ion 24 in the semiconductor layer 18 is increased up to the level exceeding the value of the dielectric withstanding voltage of the BOX layer 16, a penetration path 40 is formed at a weak spot of the BOX layer 16, and the electron (−) 42 existing in the semiconductor substrate 14 is introduced into the gate oxide film 22 through the penetration path 40 and the semiconductor layer 18. As a result, the electron 42 comes to give a damage to the gate oxide film 22, thereby insulation failure, Time Dependence Dielectric Breakdown (referred to as "TDDB" hereinafter) or other similar defects being caused.

If the ion implantation for the Vt control (threshold value adjustment) is executed by means of a high dose ion implanter provided with an electron gun, the damage of the gate oxide film 22 might be considerably suppressed since there is hardly occurred the charge-up of the electric charge in the semiconductor layer 18. Generally speaking, however, the high dose ion implanter is designed for executing the ion implantation with the ion dose amount of $1 \times 10^{14}$ ions/cm2 or more. Accordingly, if ion implantation with the ion dose amount of $2 \times 10^{12}$ ions/cm2 to $1 \times 10^{13}$ ions/cm2 is required, for instance like the case of forming the MOSFET on the SOI wafer 12, the control of the electric charge as charged up in the semiconductor layer 18 is apt to lose its uniformity, so that it becomes difficult to maintain the constant quality of the MOSFET in the manufacturing process thereof.

Still further, a report entitled "Gate Destruction by Charging Damage in Contact Etching" (TECHNICAL REPORT OF IEICE, SDM98-218 (1999–03)) points out the following problem with regard to the SOI wafer 12 on which the field oxide film 20 is formed by using the method for local oxidation of silicon (LOCOS) as shown in FIG. 6a. That is, as shown in FIG. 6e, in case of forming a contact hole 32 by the dry etching method, if the ion of halogen gas or fluorocarbon gas having the electric charge as an etchant (gas) reaches the semiconductor layer 18, the electric charge 38 is charged up in the semiconductor layer 18. As described above, this charge-up of the electric charge 38 in the semiconductor layer 18 takes place as the semiconductor layer 18 is insulated by the BOX layer 16 and the field oxide film 20 as well. If the thickness of the BOX layer 16 has a value in the thickness range of 100 nm to 120 nm, the dielectric withstanding voltage of the BOX layer 16 has a value in the voltage range of 40V to 50V, and if the charge-up potential derived from the electric charge of the etching gas ion exceeds the dielectric withstanding voltage, the permanent dielectric breakdown of the BOX layer 16 takes place and the dielectric breakdown of the gate oxide film 22 also takes place at the same time.

SUMMARY OF THE INVENTION

The present invention has been made in view of the above-mentioned problems having been experienced in the prior art, and the object of the invention is to provide a novel and improved method for manufacturing a semiconductor device, which is able to solve the above-mentioned problems and others.

In order to solve the problems as described above, according to the first aspect of the invention, there is provided a method for manufacturing a semiconductor (100, 200, 300) which includes the steps of forming an insulating region (20) for insulating an active region formed in a semiconductor layer (18) formed on a semiconductor substrate (14) through the first insulating layer (16); forming a conductive layer (102, 302) on the semiconductor layer (18) after forming the insulating region (20); and implanting ions in the semiconductor layer (18) after forming the conductive layer (102, 302), thereby forming the active region.

According to the invention, the conductive layer is formed on the semiconductor layer before the ion implantation is executed. According to this method, if the semiconductor layer in which the active region is to be formed, is insulated by both of the first insulating layer and the insulating region, the electric charge generated in the semiconductor layer at the time of the ion implantation, flows into the conductive layer and is removed therethrough. As a result, not only the first insulating layer can be prevented from being damaged, but also the yield in the process of forming the semiconductor layer can be improved.

Furthermore, the method according to the invention may further include the, step of forming the second insulating layer (22) on the semiconductor layer (18) in which the active region is to be formed, before forming the conductive layer (102, 302). In this case, the second insulating layer is formed between the semiconductor layer and the conductive layer. However, the electric charge generated in the semiconductor layer at the time of the ion implantation passes through the second insulating layer and reaches the conductive layer. Thus, if the second insulating layer is formed between the semiconductor layer and the conductive layer, the electric charge generated in the semiconductor layer can be removed. As a result, there is no or less possibility that the semiconductor layer has such an electric potential as gives any damage to the first and second insulating layers, thus the first and second insulating layers being prevented from the damage.

Moreover, the method according to the invention may further include the step of removing the conductive layer (102) after forming the active region; and forming the second insulating layer (22) on the active region of the semiconductor layer (18) after removing the conductive layer (102). According to this method, the conductive layer can be formed directly on the semiconductor layer. Therefore, the electric charge generated in the semiconductor layer can be effectively introduced to the conductive layer. As a result, even if a lot of ions are implanted in the semiconductor layer and a lot of electric charges are correspondingly generated therein, the electric charge can be certainly removed.

It is preferable that the conductive layer is made of carbon (C), since the conductive layer made of C can be removed together with the photo resist film masking a region except the active region in which ions are to be implanted, by rinsing both of them with sulfuric acid. Therefore, it is possible to omit the step of removing only the conductive layer itself. Accordingly, this contributes to suppression of the manufacturing cost and reduction of manufacturing time as well.

Still further, it is preferable that the conductive layer (302) is made of silicon (Si) containing proper impurity ions as doped therein. The conductive layer like this can be used as a member making up of the semiconductor element.

It is also preferable that the conductive layer (102, 302) made of C or Si doped with proper impurity ion is formed to have a thickness of 5 nm to 10 nm. The semiconductor layer like this does not hinder the process of the ion implantation and allows the electric charge to be surely removed.

Still further, the conductive layer (102) is preferably made of a metal which is arbitrarily selected from a metal group of gold (Au), Au-alloy, platinum (Pt), Pt-alloy, an alloy of Au and Pt, or made of aluminum (Al), and Al-alloy. The conductive layer made of each of these metals can not be removed by the sulfuric acid rinsing. Therefore, when forming a plurality of active regions by means of a plurality of steps of the ion implantation, even if the photo resist film for masking the region except the active region in which ions are to be implanted, is separately formed or removed, the conductive layer can never be removed. As a result, the conductive layer can remain as it is, even if the ion implantation is repeated many times. Furthermore, The conductive layer made of one of these metals can be removed by rinsing it with aqua redia after the ion implantation. If Al or Al-alloy is used for forming the conductive layer, Al can function as acceptors for electrons in the semiconductor layer made of Si for instance, so that a change in the quality of the semiconductor layer can be suppressed.

Furthermore, it is preferable that the conductive layer (102) made of each of the above metals have a thickness of 1 nm to 5 nm. Similar to the above, this conductive layer does not hinder the process of the ion implantation and enables the electric charge to be surely removed.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED EMBODIMENTS

The invention will now be described in detail by way of some exemplary preferred embodiments of a method for manufacturing a semiconductor device according to the invention with reference to the accompanying drawings. In the following description and drawings related to each embodiment, a like constituent thereof having a almost same function and structure is denoted with a like reference numeral or mark in order to avoid the redundant and repetitive description thereabout.

[First Preferred Embodiment]

Figure 1A:
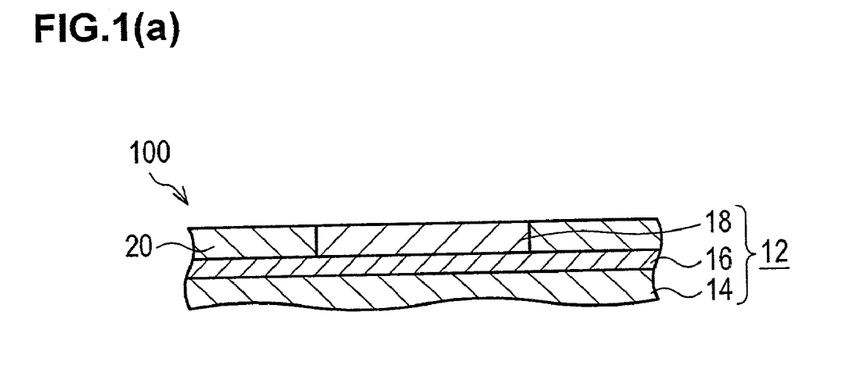
FIGS. 1a to 1e are schematic cross-sectional illustrations for describing the steps of a method for manufacturing a semiconductor device according to the invention.
Figure 1B:
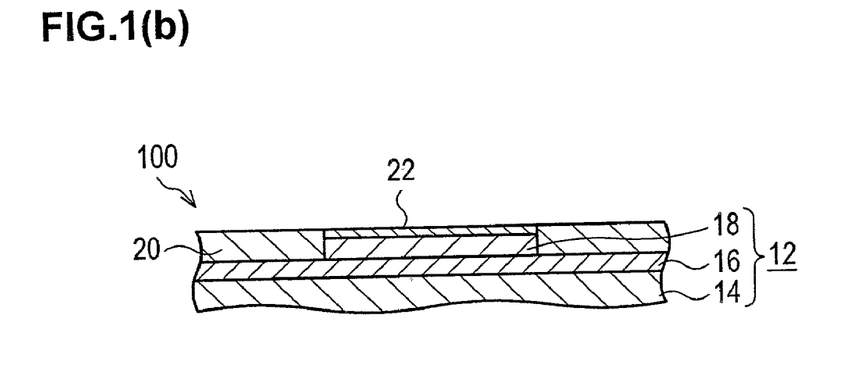
Figure 1C:
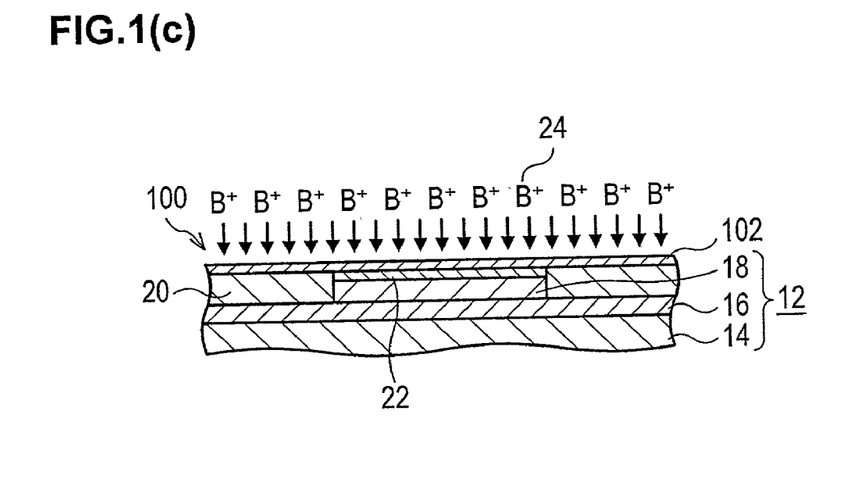
Figure 1D:
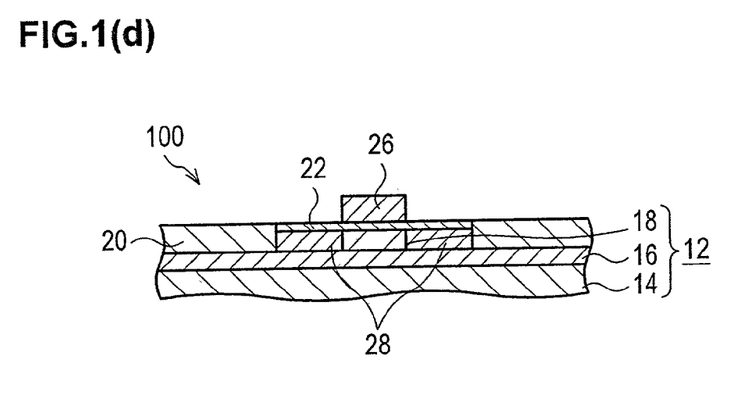

To begin with, the first preferred embodiment of the invention will be described with reference to FIGS. 1a through 1e and 2. This embodiment is characterized in that a conductive layer 102 is formed on a field oxide film 20 and a gate oxide film 22 as well, thereby removing the electric charge 38 as charged up in the semiconductor layer 18 with the help of the above conductive layer 102. In the figures as referred to the above, FIGS. 1a through 1e are schematic cross-sectional illustrations for describing the steps of a method for manufacturing a semiconductor device 100 according to the invention, and FIG. 2 is a schematic cross-sectional illustration for describing the state of the semiconductor device 100 at the time of the ion implantation as shown in FIG. 1c.

Figure 1E:
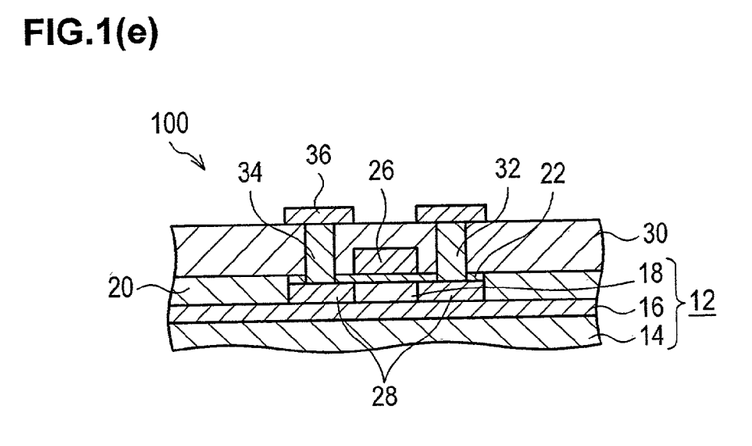
Figure 2:
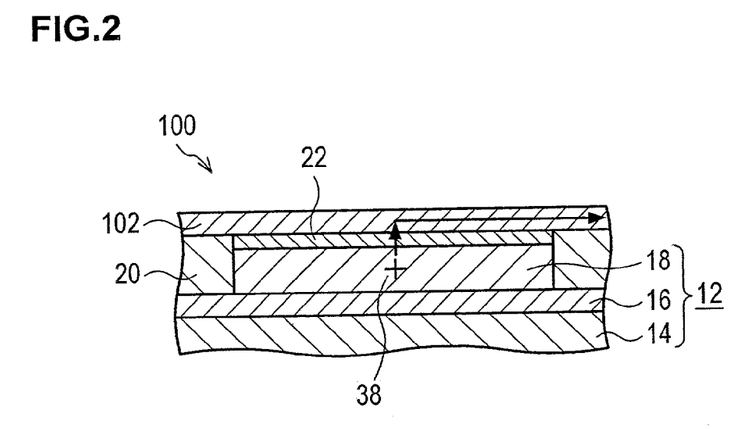
FIG. 2 is a schematic cross-sectional illustration for describing the state of the semiconductor device at the time of the ion implantation as shown in FIG. 1c.

As shown in FIG. 1e, the semiconductor device 100 manufactured by the method according to the invention is provided with a MOSFET formed on the SOI wafer 12. The SOI wafer 12 has such a structure that a BOX layer 16 and the semiconductor (Si) layer 18 are formed on a semiconductor (Si) substrate 14. The SOI wafer 12 is formed by means, of the SIMOX method or a method for sticking the BOX layer 16 and the semiconductor layer 18 together on the semiconductor substrate 14 in that order. The semiconductor substrate 14 functions as a supporter for supporting respective layers formed thereon, for instance the BOX layer 16, the semiconductor layer 18, and others. Furthermore, the BOX layer 16 functions as an insulating separator for isolating various semiconductor devices formed thereon from the semiconductor substrate 14.

The MOSFET is formed on the SOI wafer 12 according to the following steps. To begin with, the field oxide film 20 is formed in the semiconductor layer 18 as shown in FIG. 1a by means of the LOCOS method. This field oxide film 20 acts as an element isolation region for isolating an active region formed in the semiconductor layer 18 from the surrounding, the active region being a source/drain region 28, for instance. With the structure as described above, the semiconductor 18 can be insulated by the BOX layer 16 and the field oxide film 20 as swell.

In the next, as shown in FIG. 1b, the semiconductor layer 18 receives the oxidation treatment for forming the gate oxide film 22. The gate oxide film 22 functions as the gate of the MOSFET. In this case, the gate oxide film 22 is formed so as to have a thickness meeting the design rule, for instance a thickness of 5 nm to 8 nm.

The next step is a feature of the present embodiment. That is, as shown in FIG. 1c, a conductive layer 102 is formed to cover the entire surface of the SOI wafer 12, that is, to cover both of the field oxide film 20 and the gate oxide film 22. The conductive layer 102 is formed by means of a sputtering method for sputtering a suitable conductive material, for instance carbon (C), gold (Au), Au-alloy, platinum (Pt), Pt-alloy, an alloy of Au and Pt, aluminum (Al), and Al-alloy, and preferably amorphous carbon, Au, Pt, and Al Furthermore, the conductive layer 102 is formed so as to have such a thickness that allows the electric charge 38 generated in the semiconductor layer 18 at the time of the ion implantation described later to be removed to the outside. The thickness of the conductive layer 102 is determined depending on the conductive material as adopted, for instance, 5 nm to 10 nm if amorphous carbon is used, and 1 nm to 5 nm when Au, Pt, or Al is employed.

Then, as shown in FIG. 1c, the channel ion B+ 24 of the dose amount of $2 \times 10^{12}$ to $1 \times 10^{13}$ is implanted in the interface between the semiconductor layer 18 and the gate oxide 22 by means of an intermediate dose ion implanter. The implantation of the channel ion such as B+ 24 is carried out in general for the purpose of the Vt control. In this case, the ion implantation is executed for the n-channel MOS portion and the p-channel MOS portion separately, by making use of the lithography method. That is, when implanting the channel ion in the n-channel MOS portion, the upper part of the p-channel MOS portion has to be covered with a photo resist film (not shown). Contrary to this, when implanting the channel ion in the p-channel MOS portion, the upper part of the n-channel MOS portion has to be covered with the photo resist film (not shown).

As previously described, at the time of the ion implantation, the electric charge 38 due to the ion (B+) as implanted is generated in the semiconductor layer 18. Here, let us discuss the mechanism for removing the electric charge generated in the semiconductor layer 18, which is the feature of this embodiment, with reference to FIG. 2.

The conductive layer 102 is formed so as to cover the entire surface of the SOI wafer 12 including the upper surface of the field oxide film 20 and the same of the gate oxide film 22 of the semiconductor device 100 according to the present embodiment. With this structure, the electric charge 38 generated in the semiconductor layer 18 results in a Fowler-Nordheim (FN) current, which in turn passes through the gate oxide film 22 in the direction indicated by an arrow as shown in FIG. 2 and flows into the conductive layer 102. Furthermore, the FN current having entered the conductive layer 102 is removed the outside, for instance, via the support member for the SOI wafer 12 of the ion implanter which is in contact with the conductive layer 102. The electron generated in the conductive layer 102 possibly gets in the semiconductor layer 18 via the gate oxide film 22, and electrically neutralizes the electric charge 38 charged up in the semiconductor layer, thereby removing it.

For instance, the resistivity of the conductive layer 102 made of amorphous carbon is $4.1 \times 10^{-3}$ Ω·cm. Here, let us consider the resistance of the conductive layer 102 by letting the film thickness of the conductive layer 102 be 10 nm and assuming a rectangle shaped region of the conductive layer 102. If the region has a width of 1 cm and a length equal to the distance from the center of the SOI wafer 12 having a diameter of 150 mm ϕ to the edge of the same i.e. 75 mm, the region of the conductive layer 102 has a resistance of 30.7 kΩ. If B+ 24 is implanted against the conductive layer 102 at the dose amount of $1 \times 10^{13}$ ions/cm2 for one minute, the ion current becomes 27 nA/cm2 and the charge-up potential difference of the semiconductor layer 18 becomes no more than 0.8 mV. The FN current flowing through the gate oxide film 22 is $1.3 \times 10^{-5}$ A(13 μA)/cm2 at the potential difference of 6V if the thickness of the gate oxide film 22 is 6 nm. Furthermore, even if the thickness of the gate oxide film 22 is 8 nm, the FN current becomes the same as the above i.e. $1.3 \times 10^{-5}$ A(13 μA)/cm2 at the potential difference of 8V. Therefore, according to the present embodiment, the potential difference due to the electrical charge 38 charged up in the semiconductor layer 18 can not exceed 10V. Furthermore, in case of the conductive layer 102 made of amorphous carbon, if its thickness is 5 nm or so, the above potential difference can be suppressed to a value of 10V or less. Accordingly, if the potential difference due to the electrical charge charged up in the semiconductor 18 is 10V or less, the gate oxide film 22 can not be damaged as indicated in the above Table 1. As a result, there is happened neither dielectric withstanding voltage failure nor the TDDB failure, thus the semiconductor device 100 being highly improved in the reliability thereof.

Similar to the above, the conductive layers 102 made of Au, Pt, and Al have a resistivity of $2.4 \times 10^{-6}$ Ω·cm, $10.6 \times 10^{-6}$ Ω·cm, and $2.75 \times 10^{-6}$ Ω·cm, respectively. Now, again let us consider the resistance of the conductive layer 102 by letting the film thickness of the conductive layer 102 be 10 nm and assuming a rectangle shaped region of the conductive layer 102. If the region has a width of 1 cm and a length equal to the distance from the center of the SOI wafer 12 with a diameter of 150 mm ϕ to the edge of the same i.e. 75 mm, an Au layer, a Pt layer, and an Al layer as the conductive layer 102 have a resistance of 180Ω, 794Ω, and 206Ω, respectively. If B+ 24 is implanted against the conductive layer 102 at the dose amount of $1 \times 10^{13}$ ions/cm2 for one minute, the ion current becomes 27 nA/cm2, the charge-up potential difference of the semiconductor layer 18 becomes no more than 5 mV in the Au layer, 0.02 mV in the Pt layer, and 6 mV in the Al layer, respectively. Still further, the FN current flowing through the gate oxide film 22 is $1.3 \times 10^{-5}$ A(13 μA)/cm2 at the potential difference of 6V to 8V if the thickness of the gate oxide film 22 is in the range of 6 nm to 8 nm. Therefore, if the above-mentioned metal materials are adopted for forming the conductive layer 108, the potential difference due to the electrical charge 38 charged up in the semiconductor layer 18 can not exceed 10V. However, in case of adopting the above-mentioned metal materials for forming the conductive layer 102, it is preferable that the conductive layer is formed so as to have a thickness of less than 5 nm.

Furthermore, if Al is adopted to form the conductive layer 102, Al can function as acceptors for electrons in the semiconductor layer 18 made of Si. Therefore, even though the ion implantation of B+ 24 is executed in the knock-on state, there is no generation of the recombination center accompanied by impurities and lattice defects of the semiconductor layer 18, thus nothing deteriorating the characteristics of the FET element being caused.

Now, again let us go back to the description on the manufacturing steps of the semiconductor device 100. After finishing the ion implantation step as described above, the conductive layer 102 is removed as shown in FIG. 1d. At this time, if the conductive layer 102 is made of amorphous carbon, the photo resist film formed on the conductive layer 102 and used for the ion implantation is removed along with the conductive layer 102, because the photo resist film can be removed in general by rinsing it with sulfuric acid. Amorphous carbon forming the conductive layer 12 can be also removed by the sulfuric acid rinsing so that both of the conductive layer 102 and the photo resist film can be removed at the same time. As a result, it is not necessary to separately prepare the step of removing only the conductive layer 102. This contributes to suppression of the manufacturing cost and reduction of manufacturing time as well.

Differing from the conductive layer 102 made of amorphous carbon as described above, if the conductive layer 102 is made of Au, Pt, or Al, these layer can not be removed by the sulfuric acid rinsing, which can remove the photo resist film, though. Thus, the conductive layer 102 made of the above metal is removed by rinsing it with aqua regia (a mixture of concentrated hydrochloric acid (3 vol.) and concentrated nitric acid (1 vol.)). As has been previously described, the ion implantation is separately and selectively executed with respect to the n-channel MOSFET and the p-channel MOSFET. Therefore, there are repeated a plurality of times the steps of properly forming the photo resist film on the n-channel MOSFET or the p-channel MOSFET, executing the ion implantation thereto, and removing the photo resist film by the sulfuric acid rinsing. Accordingly, if the conductive layer 102 made of the above metal is adopted, it can not be removed in the step of the sulfuric acid rinsing for removal of the photo resist film, and the above-mentioned suppression of charge-up electric charge is done with respect to the same conductive layer 102 until the removal of it by the aqua regia rinsing.

After removal of the conductive layer 102, a gate electrode 26 is formed on the gate oxide film 22 as shown in FIG. 1d. The gate electrode 26 is formed for instance by means of the CVD method and the photolitho-etching. The gate electrode 26 consists of a conductive material such as polycrystalline silicon (referred to as "poly-silicon" hereinafter). After forming the gate electrode 26, a source/drain region 28 is formed in the semiconductor region 18. The source/drain region 28 is formed by means of the self-alignment technique by make use of the gate electrode 26 and the high dose ion implantation, technique as well.

Then, as shown in FIG. 1e, an inter-layer insulating film 30 is formed on the entire surface of the SOI wafer 12. The inter-layer insulating film 30 is formed by the CVD method for instance, and consists of an insulating material, for instance SI02, Boron-phospho silicate glass (BPSG), or the like. After this, the photolitho-etching is applied to the inter-layer insulating film 30 and the gate oxide film 22 to form a contact hole 32, which penetrates through the inter-layer insulating film 30 and the gate oxide 22 and is connected with the source/drain region 28. Then, the buried plug 34 is buried into the contact hole 32. The buried plug 34 is formed by means of the sputtering method, for instance, and consists of a conductive material such as tungsten (W). In the next, a wiring layer 36 is formed on the buried plug 34. The wiring layer 36 is formed by sputtering a conductive material such as Al. As a result of executing each of the steps as described above, there is completed the semiconductor device 100 including the MOSFET formed on the SOI wafer 12. However, in FIG. 1e, it is omitted to show the wiring connected with the gate electrode 26 and the wiring layer 36 as well.

[Second Preferred Embodiment]

Next, another method for manufacturing a semiconductor device 200 according to the second embodiment of the, invention will be described with reference to FIGS. 3a–3e and 4. This embodiment is characterized in that the conductive layer 102 is formed before forming the gate oxide layer 22. FIGS. 3a through 3e are schematic cross-sectional illustrations for describing the steps of another method for manufacturing a semiconductor device 200 according to the invention, and FIG. 4 is a schematic cross-sectional illustration for describing the state of the semiconductor device 200 at the time of the ion implantation as shown in FIG. 3b.

Figure 3A:
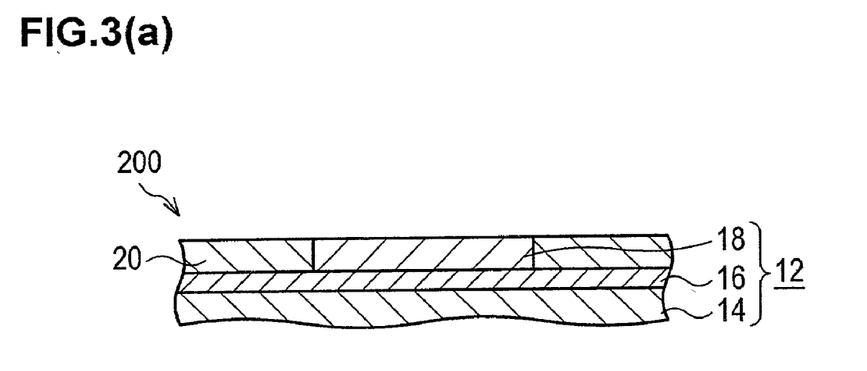
FIGS. 3a to 3e are schematic cross-sectional illustrations for describing the steps of another method for manufacturing a semiconductor device according to the invention.
Figure 3B:
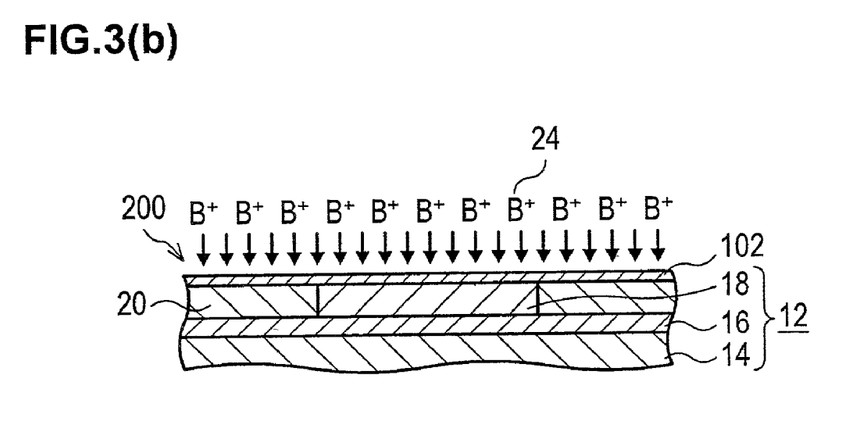

In case of forming the semiconductor device 200 according to the second embodiment of the invention, as shown in FIG. 3a, the field oxide film 20 is first formed on the semiconductor layer 18 of the SOI wafer 12 in the same way as the manufacturing step of the semiconductor device 100 as shown in FIG. 1a. At this time, however, the gate oxide film 22 is not formed yet.

Then, there is carried out a manufacturing step which features the second embodiment of the invention. That is, as shown in FIG. 3b, the conductive layer 102 is formed directly on the field oxide film 20 as well as on the semiconductor layer 18 before forming the gate oxide film 22. The conductive layer 102 is formed in the same way as described with respect to the first embodiment by using a conductive material such as C, Au, Au-alloy, Pt, Pt-alloy, an alloy of Au and Pt, Al), and Al-alloy, and preferably amorphous carbon, Au, Pt, and Al. The thickness of the conductive layer 102 is to be determined in correspondence with the above conductive material as adopted. In the next, the ion B+ 24 are implanted into the interface between the semiconductor layer 18 and the gate oxide film 22 in the same manner as the step of manufacturing the semiconductor device 100 as indicated in FIG. 1c.

Figure 4:
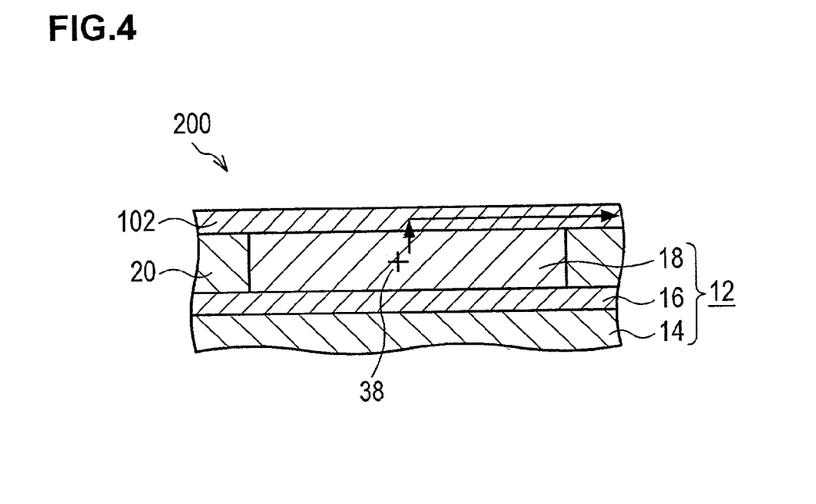
FIG. 4 is a schematic cross-sectional illustration for describing the state of the semiconductor device at the time of the ion implantation as shown in FIG. 3b.

As will be seen from FIG. 3b and FIG. 4, the semiconductor layer 18 and the conductive layer 102 of the semiconductor device 200 make a direct contact with each other. The electric charge 38 charged up in the semiconductor layer 18 flows as the FN current in the direction as indicated by a arrow mark shown in FIG. 4 and disappears after directly passing through the semiconductor layer 18. Therefore, even if the ion implantation is executed at the dose amount of $1 \times 10^{14}$ ions/cm2, the semiconductor layer 18 can be prevented from being charged up with the electric charge 38. As a result, no recombination center is generated in the semiconductor layer 18 even when carrying out the ion implantation with the high dose amount, thus preventing the FET characteristics from being deteriorated.

Figure 3C:
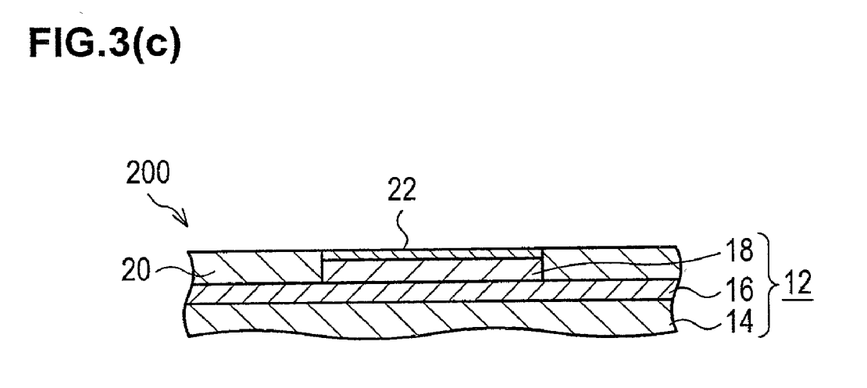

After the step of the ion implantation, the conductive layer 102 is removed as indicated in FIG. 3c. The removal of the conductive layer 102 is carried out by means of the sulfuric acid rinsing if the conductive layer 102 is made of amorphous carbon, or by means of the aqua regia rinsing if the same is made of a conductive metal such as Au, Pt, Al or the like.

Figure 3D:
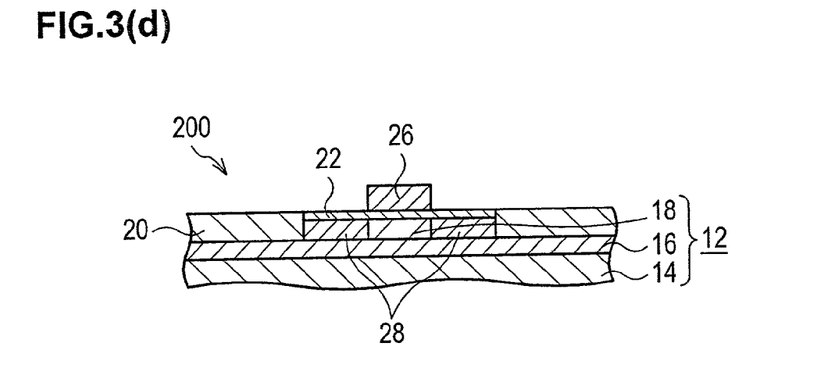
Figure 3E:
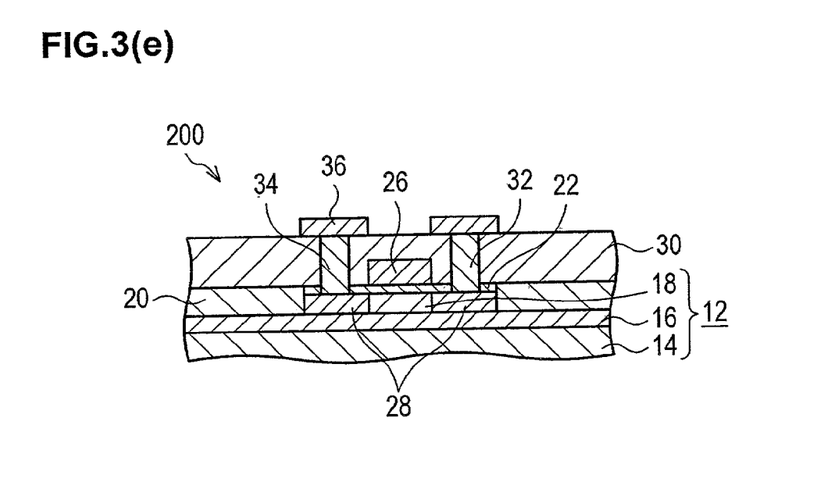

After removing the conductive layer 102, the gate oxide film 22 is formed by oxidizing the surface of the semiconductor layer 18 as indicated in FIG. 3c in the same manner as the method of manufacturing the semiconductor device 100 as shown in FIG. 1b. Next, there are formed in sequence the gate electrode 26, the source/drain region 28, the buried plug 34, and the wiring layer 36 as shown in FIGS. 3d and 3e in the same way as the manufacturing the semiconductor device 100 as shown in FIGS. 1d and 1e. As a result of executing each of the steps as described above, there is completed the semiconductor device 200 including the MOSFET formed on the SOI wafer 12.

[Third Preferred Embodiment]

In the next, still another method for manufacturing a semiconductor device 300 according to the third embodiment of the invention will be described with reference to FIGS. 5a through 5e. This embodiment is characterized in that the conductive layer 302 is made of a poly-silicon doped with phosphorus (P) or boron (B). FIGS. 5a through 5e are schematic cross-sectional illustrations for describing the steps of still another method for manufacturing a semiconductor device 300 according to the invention.

Figure 5A:
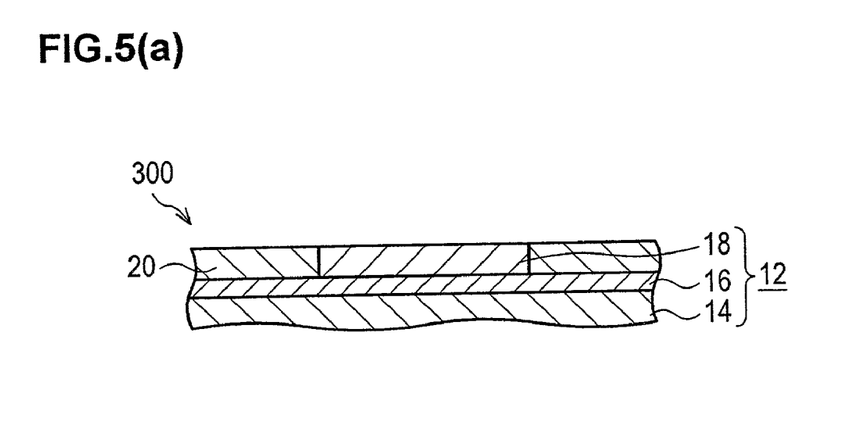
FIG. 5a to FIG. 5e are schematic cross-sectional illustrations for describing the steps of still another method for manufacturing a semiconductor device according to the invention.
Figure 5B:
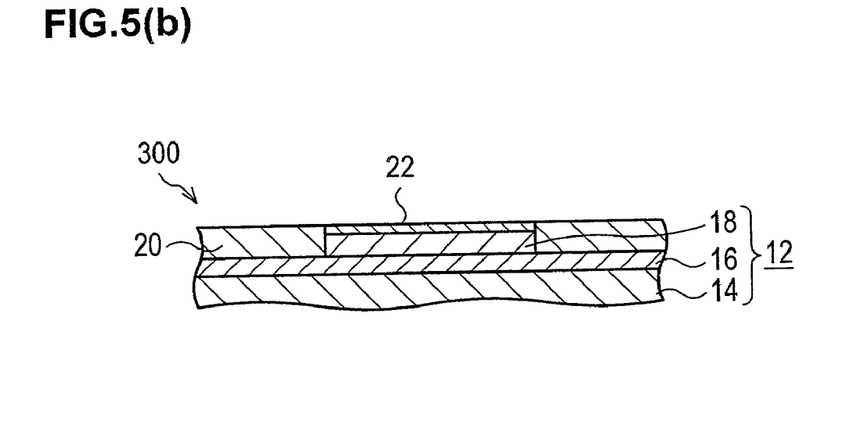

In case of forming the semiconductor device 300 according to the third embodiment of the invention, as shown in FIGS. 5a and 5b, the field oxide film 20 and the gate oxide film 22 are formed on the semiconductor layer 18 of the SOI wafer 12 in the same manner as the manufacturing step of the semiconductor device 100 as shown in FIGS. 1a and 1b.

Figure 5C:
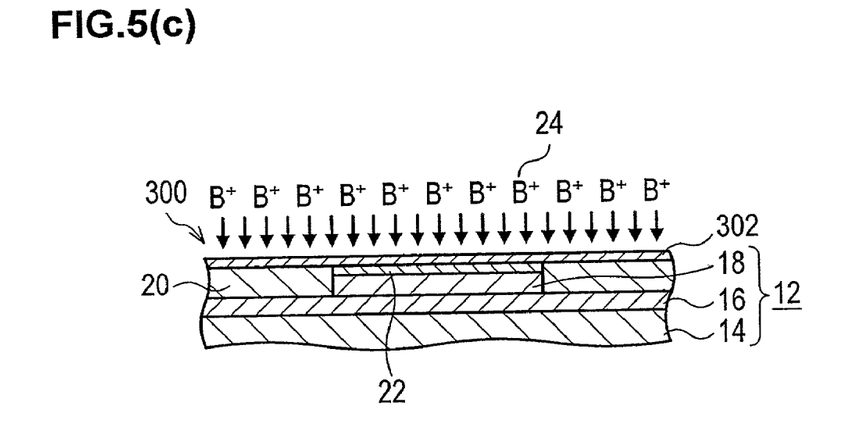

Then, there is carried out a manufacturing step which features the third embodiment of the invention. That is, as shown in FIG. 5c, the conductive layer 302 is formed on the entire surface of the SOI wafer 12 so as to cover the field oxide film 20 and the gate oxide film 22 as well. The conductive layer 302 is formed as follows. An undoped poly-silicon layer is formed on the entire surface of the SOI wafer 12 by means of the CVD method, for instance. The undoped poly-silicon layer is formed so as to have a thickness of 5 nm to 10 nm, for instance. This is a suitable thickness capable of removing the electric charge 38 charged up in the semiconductor layer 18 at the time of carrying out the ion implantation step, after P or B doping described later. Then, the P or B ion implantation at the dope amount to the extent of $1 \times 10^{16}$ ions/cm2 is executed against the undoped poly-silicon, thereby forming the conductive layer 302 consisting of the doped poly-silicon.

After forming the conductive layer 302, similar to the step of the method of manufacturing the semiconductor device 100 as shown in FIG. 1c, B+ 24 is implanted in the interface between the semiconductor layer 18 and the gate oxide film 22. At this time, the electric charge 38 charged up in the semiconductor layer 18 is removed through the gate oxide film 22 and the conductive layer 302 as well. For instance, the resistivity of the conductive layer 302 is 0.48Ω·cm. Here, again let us consider the resistance of the conductive layer 302 by letting the film thickness of the conductive layer 302 be 10 nm and assuming a rectangle shaped region of the conductive layer 302. If the region has a width of 1 cm and a length equal to the distance from the center of the SOI wafer 12 with a diameter of 150 mm φ to the edge of the same i.e. 75 mm, the region of the conductive layer 302 has a resistance of 3.6 MΩ. If B+ 24 is implanted against the conductive layer 302 at the dose amount of $1 \times 10^{13}$ ions/cm2 for one minute, the ion current becomes 27 nA/cm2 and the charge-up potential difference of the semiconductor layer 18 becomes no more than 0.1V. The FN current flowing through the gate oxide film 22 is $1.3 \times 10^{-5}$ A(13 μA)/cm2 at the potential difference of 6V to 8V if the thickness of the gate oxide film 22 is 6 nm to 8 nm. Therefore, even when adopting the conductive layer 302 made of the doped poly-silicon, the potential difference due to the electrical charge 38 charged up in the semiconductor layer 18 can not exceed 10V. Furthermore, if the thickness of the conductive layer 302 is 5 nm or so, the above potential difference can be suppressed to a value of 10V or less. As a result, since the potential difference due to the electrical charge charged up in the semiconductor 18 is 10V or less, there is happened neither dielectric withstanding voltage failure nor the TDDB failure.

Figure 5D:
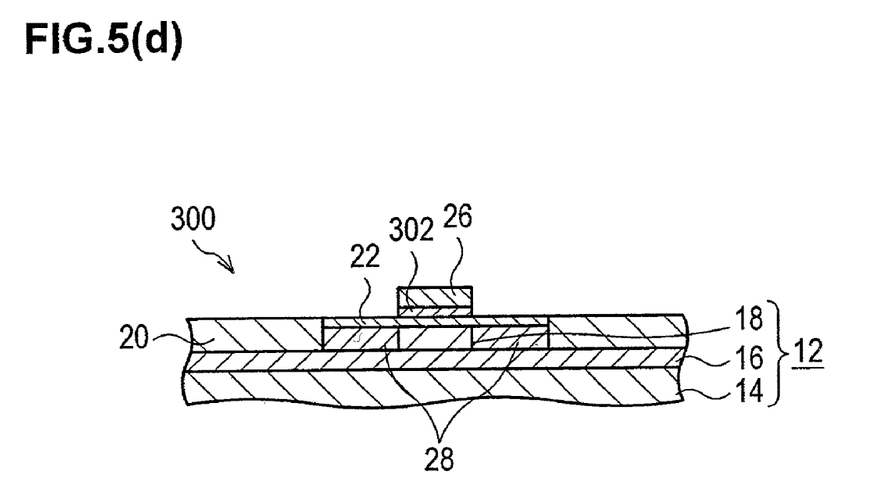

Differing from the first and second embodiment as described above, after executing the step of the ion implantation, as shown in FIG. 5d, the gate electrode 26 is formed on the conductive layer 302 located above the semiconductor layer 18 without removing the conductive layer 302. This gate electrode 26 is formed by the following steps, that is, the steps of first forming the poly-silicon layer on the conductive layer 302 by means of the CVD method, forming the photo resist film (not shown) in a predetermined position on the poly-silicon layer located above the semiconductor layer 18, and etching the poly-silicon layer and the conductive layer 302 by using the photo resist film as a mask. According to the present embodiment, the conductive layer 302 is made of doped poly-silicon of which the doping level is approximately equal to that of the gate electrode 26. Accordingly, if the conductive layer 302 remains as a lower layer of the gate electrode 26, the former can function as the latter. Furthermore, according to the present embodiment, it is not necessary to prepare the step of removing the conductive layer 302 independently. Therefore, This contributes to suppression of the manufacturing cost and reduction of manufacturing time as well.

Figure 5E:
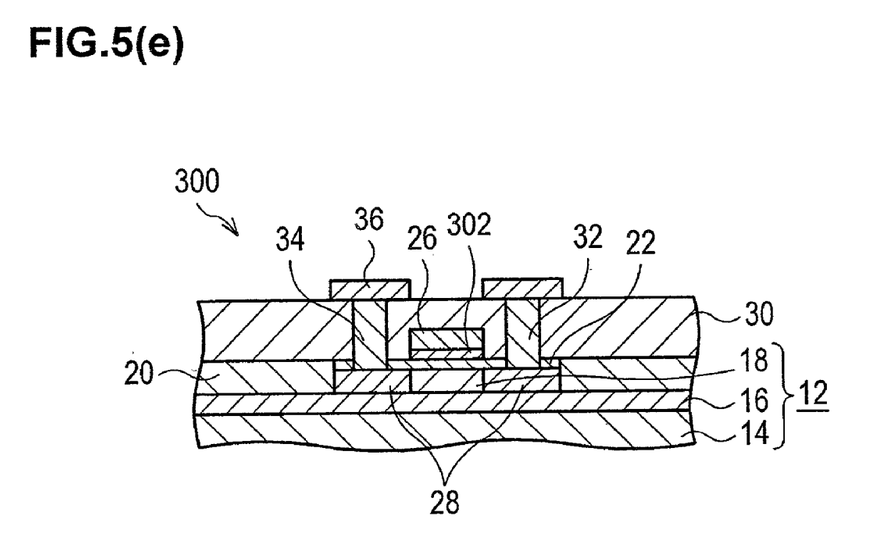

After forming the gate electrode, there are formed in sequence the source/drain region 28, the buried plug 34, and the wiring layer 36 as shown in FIG. 5e in the same way as the manufacturing the semiconductor device 100 as shown in FIG. 1e. As a result of executing each of the steps as described above, there is completed the semiconductor device 300 including the MOSFET formed on the SOI wafer 12.

Some preferred embodiments of the invention have been discussed so far with reference to the accompanying drawings. Needless to say, however, the invention is not to be limited by those embodiments. It is apparent that any one who has an ordinary skill in the art can make various changes and modifications within the technical thoughts as recited in the scope of claim for patent as attached hereto, and it is understood that those changes and modifications are covered by the technical scope of the invention.

What is claimed is:

1. A method for manufacturing a semiconductor device comprising:
    forming a first insulating layer on a semiconductor substrate;
    forming a semiconductor layer on said first insulating layer;
    forming an insulating region on said first insulating layer to insulate said semiconductor layer;
    forming a conductive layer on said semiconductor layer after forming said insulating region; and
    implanting ions in said semiconductor layer after forming said conductive layer, thereby forming an active region within said semiconductor layer.

2. A method as claimed in claim 1 wherein said conductive layer is made of carbon (C).

3. A method as claimed in claim 2 wherein said conductive layer has a thickness of 5 nm to 10 nm.

4. A method as claimed in claim 1 wherein said conductive layer is made of silicon (Si) doped with impurity ions.

5. A method as claimed in claim 4 wherein said conductive layer has a thickness of 5 nm to 10 nm.

6. A method as claimed in claim 1 wherein said conductive layer is made of an arbitrary metal selected from a metal group including gold (Au), an Au-alloy, platinum (Pt), a Pt-alloy, and an alloy of Au and Pt.

7. A method as claimed in claim 6 wherein said conductive layer has a thickness of 1 nm to 5 nm.

8. A method as claimed in claim 1 wherein said conductive layer is made of aluminum (Al) or an Al-alloy.

9. A method as claimed in claim 8 wherein said conductive layer has a thickness of 1 nm to 5 nm.

10. A method as claimed in claim 1 further comprising forming a second insulating layer on said semiconductor layer in which said active region is formed.

11. A method as claimed in claim 10 wherein said conductive layer is made of carbon (C).

12. A method as claimed in claim 11 wherein said conductive layer has a thickness of 5 nm to 10 nm.

13. A method as claimed in claim 10 wherein said conductive layer is made of silicon (Si) doped with impurity ions.

14. A method as claimed in claim 13 wherein said conductive layer has a thickness of 5 nm to 10 nm.

15. A method as claimed in claim 10 wherein said conductive layer is made of an arbitrary metal selected from a metal group including gold (Au), an Au-alloy, platinum (Pt), a Pt-alloy, and an alloy of Au and Pt.

16. A method as claimed in claim 15 wherein said conductive layer has a thickness of 1 nm to 5 nm.

17. A method as claimed in claim 10 wherein said conductive layer is made of aluminum (Al) or an Al-alloy.

18. A method as claimed in claim 17 wherein said conductive layer has a thickness of 1 nm to 5 nm.

19. A method as claimed in claim 1 further comprising:
    removing said conductive layer after said implanting ions; and
    forming a second insulating layer on said active region of said semiconductor layer after removing said conductive layer.

20. A method as claimed in claim 19 wherein said conductive layer is made of carbon (C).

21. A method as claimed in claim 20 wherein said conductive layer has a thickness of 5 nm to 10 nm.

22. A method as claimed in claim 19 wherein said conductive layer is made of silicon (Si) doped with impurity ions.

23. A method as claimed in claim 2 wherein said conductive layer has a thickness of 5 nm to 10 nm.

24. A method as claimed in claim 1 wherein sad conductive layer is made of an arbitrary metal selected from a metal group including gold (Au), an Au-alloy, platinum (Pt), a Pt-alloy, and an alloy of Au and Pt.

25. A method as claimed in claim 24 wherein said conductive layer has a thickness of 1 nm to 5 nm.

26. A method as claimed in claim 19 wherein said conductive layer is made of aluminum (Al) or an Al-alloy.

27. A method as claimed in claim 26 wherein said conductive layer has a thickness of 1 nm to 5 nm.

* * * * *